United States Patent
Sakakibara et al.

(10) Patent No.: US 8,873,325 B2
(45) Date of Patent: Oct. 28, 2014

(54) SEMICONDUCTOR DEVICE PERFORMING REFRESH OPERATION

(71) Applicant: Elpida Memory, Inc., Tokyo (JP)

(72) Inventors: Kenichi Sakakibara, Tokyo (JP); Toru Ishikawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 97 days.

(21) Appl. No.: 13/670,802

(22) Filed: Nov. 7, 2012

(65) Prior Publication Data

US 2013/0114364 A1    May 9, 2013

(30) Foreign Application Priority Data

Nov. 7, 2011    (JP) .................................. 2011-243636

(51) Int. Cl.
*G11C 7/00*    (2006.01)
*G11C 11/406*    (2006.01)

(52) U.S. Cl.
CPC .... *G11C 11/40626* (2013.01); *G11C 11/40618* (2013.01)
USPC ..................................... 365/222; 365/230.03

(58) Field of Classification Search
CPC ... G11C 8/12; G11C 11/406; G11C 11/40626
USPC ................................................ 365/222, 230.3
See application file for complete search history.

(56) References Cited

U.S. PATENT DOCUMENTS

| | | | |
|---|---|---|---|
| 2009/0168840 A1* | 7/2009 | Song et al. ..................... | 374/170 |
| 2010/0054067 A1* | 3/2010 | Mitchell, Jr. .................. | 365/211 |
| 2012/0099389 A1* | 4/2012 | Park et al. ..................... | 365/200 |
| 2012/0163413 A1* | 6/2012 | Kim et al. ..................... | 374/152 |

FOREIGN PATENT DOCUMENTS

JP    2009-163585 A    7/2009

* cited by examiner

*Primary Examiner* — Hoai V Ho
(74) *Attorney, Agent, or Firm* — McGinn IP Law Group, PLLC

(57) ABSTRACT

Disclosed herein is a device that includes a first semiconductor chip. The first semiconductor chip includes a first data storage area storing data, a first refresh circuit repeating a first refresh operation on the first data storage area to make the first data storage area retain the data, a first terminal supplied with a first control signal from outside of the first semiconductor chip, and a first control circuit coupled between the first terminal and the first refresh circuit to control a repetition cycle of the first refresh operation in response to the first control signal.

9 Claims, 10 Drawing Sheets

SEMICONDUCTOR DEVICE PERFORMING REFRESH OPERATION

BACKGROUND OF THE INVENTION

1. Field of the Invention

The present invention relates to a semiconductor device.

2. Description of Related Art

In recent years, a semiconductor device having a plurality of semiconductor chips (e.g., an MCP (Multi Chip Package) and a POP (Package On Package) are known. In such a semiconductor device, two or more semiconductor chips are disposed adjacent to each other. In a case where such a semiconductor device has two semiconductor chips, one of which is a flash memory chip (first memory chip) and the other is a DRAM (Dynamic Random Access Memory) chip (second semiconductor chip), a temperature of the DRAM rises along with a temperature rise of the accessed flash memory chip. The DRAM chip may malfunction due to the temperature rise. In order to prevent such malfunction of the DRAM chip, such a semiconductor device changes a period of refresh operation for data retention of a memory cell in the DRAM chip (second semiconductor chip) in response to an access request made to the flash memory chip (first semiconductor chip) (refer to Japanese Patent Application Laid-Open No. 2009-163585).

However, in the above-described semiconductor device having the flash memory chip and DRAM chip, in order to prevent the malfunction of the DRAM chip, a period of the refresh operation (refresh period) in the DRAM chip is inevitably changed in response to an access request made to the flash memory chip. Therefore, even when the temperature of the flash memory chip does not rise actually, the refresh period of the DRAM chip may often be shortened. Thus, in the semiconductor device as described above, the refresh period of the DRAM chip (second semiconductor chip) is changed for each access request to the flash memory chip (first semiconductor chip) regardless of whether necessary or not, increasing the number of times of the refresh operation, which unnecessarily increases current consumption.

As described above, the above-described semiconductor device has a problem in that the refresh period is unnecessarily changed to result in wasted current consumption.

SUMMARY

In one embodiment, there is provided a device that includes a first semiconductor chip including a first temperature sensor outputting a first temperature signal, a second semiconductor chip coupled to receive the first temperature signal, the second semiconductor chip being configured to refresh data stored therein in a cycle that is response to the first temperature signal.

In another embodiment, there is provided a device that includes a first semiconductor chip. The first semiconductor chip includes: a first data storage area storing data; a first refresh circuit repeating a first refresh operation on the first data storage area to make the first data storage area retain the data; a first terminal supplied with a first control signal from outside of the first semiconductor chip; and a first control circuit coupled between the first terminal and the first refresh circuit to control a repetition cycle of the first refresh operation in response to the first control signal.

DETAILED DESCRIPTION OF THE EMBODIMENTS

Some semiconductor devices according to embodiments of the present invention will be described with reference to the accompanying drawings.

First Embodiment

A semiconductor device according to the present embodiment has two DRAM (Dynamic Random Access Memory) chips and one SOC (System-on-a-Chip) chip. Further, in the present embodiment, these three semiconductor chips are mounted in one package using a TSV (Through Silicon Via) technology.

Figure 1A:
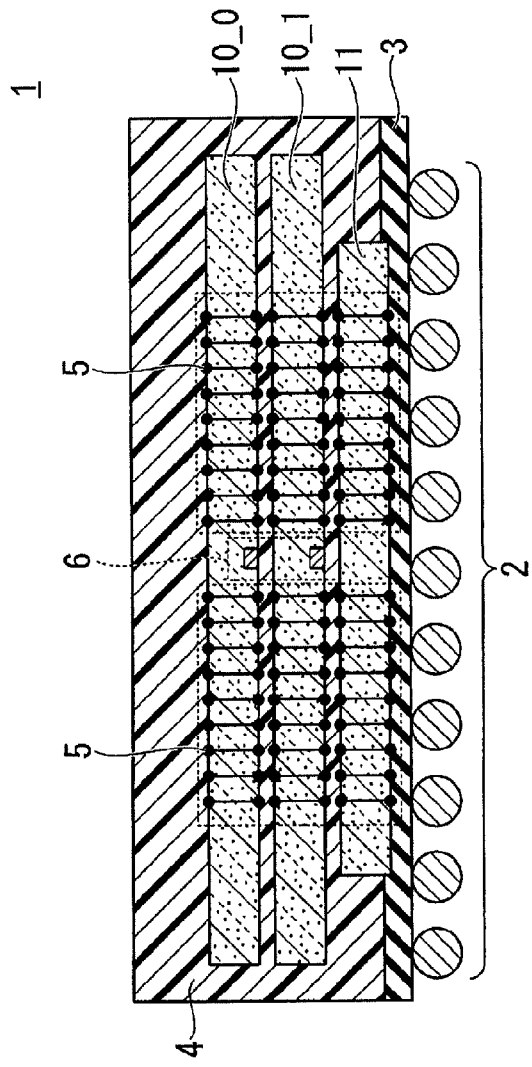
FIG. 1A is a cross sectional view indicative of a semiconductor device according to a first embodiment of the present invention.

Referring now to FIG. 1A, the semiconductor device 1 has two DRAM chips 10_0 and 10_1, an SOC chip 11, and a package substrate 3. The SOC chip 11 and two DRAM chips 10_0 and 10_1 are stacked on the package substrate 3 and covered (encapsulated) by an encapsulation resin 4. That is, the plurality of semiconductor chips (two DRAM chips 10_0 and 10_1 and SOC chip 11) are mounted on the package substrate 3. The plurality of semiconductor chips and package substrate 3 are encapsulated by the same encapsulation resin 4 (resin).

External connection terminals 2 are formed on a surface of the package substrate 3 on a side opposite to a surface covered by the encapsulation resin 4.

Each of the external connection terminals 2 is, e.g., a solder ball and electrically connects the semiconductor device 1 and an external device.

The SOC chip 11 is a controller chip that controls the DRAM chips (10_0, 10_1). The SOC chip 11 outputs a command signal or an address signal to the DRAM chips (10_0, 10_1) so as to control the DRAM chips (10_0, 10_1).

Each of the DRAM chips (10_0, 10_1) is a semiconductor chip in which refresh operation for data retention of a memory cell is executed. A detailed configuration of the DRAM chips (10_0, 10_1) will be described later.

In FIG. 1A, the DRAM chips 10_0 and 10_1 and SOC chip 11 each have a plurality of through electrodes 5 penetrating therethrough, and the through electrodes of one chip are connected to the corresponding through electrodes of the other chips. The DRAM chips 10_0 and 10_1 each have a test pad 6 on a surface thereof. Details of the test pad 6 will be described later.

Figure 1B:
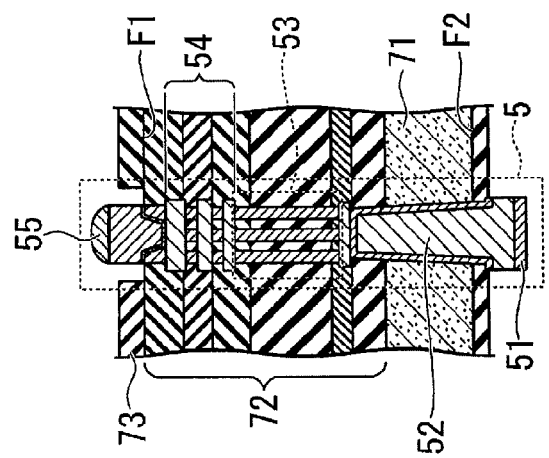
FIG. 1B is an enlarged cross sectional view indicative of a through electrode shown in FIG. 1A.

Turning to FIG. 1B, the through electrode 5 has a rear surface electrode 51, a substrate through electrode 52, a contact plug 53, a wiring pad 54, and a front surface electrode 55. The through electrode 5 penetrates each of the semiconductor chips 10_0, 10_1, and 11 from a front surface F1 (first surface) to a rear surface F2 (second surface) which are opposed to each other to electrically conduct the front surface electrode 55 (electrode terminal) formed on the front surface F1 and rear surface electrode 51 (electrode terminal) formed on the rear surface F2.

The substrate through electrode 52 penetrates a semiconductor substrate 71 to connect the rear surface electrode 51 and contact plug 53. The contact plug 53 penetrates an interlayer dielectric film formed on a surface of the semiconductor substrate 71 to connect the substrate through electrode 52 and wiring pad 54. The wiring pad 54 is connected to a signal line in the semiconductor chip and used for input/output of a signal between the semiconductor chip and an external device. The front surface electrode 55 is formed on an uppermost layer of the wiring pad 54. The front surface F1 (first surface) has thereon a passivation film 73 in an area in which the front surface electrode 55 is not formed. The wiring pad 54 has therein an interlayer dielectric film 72.

Figure 2:
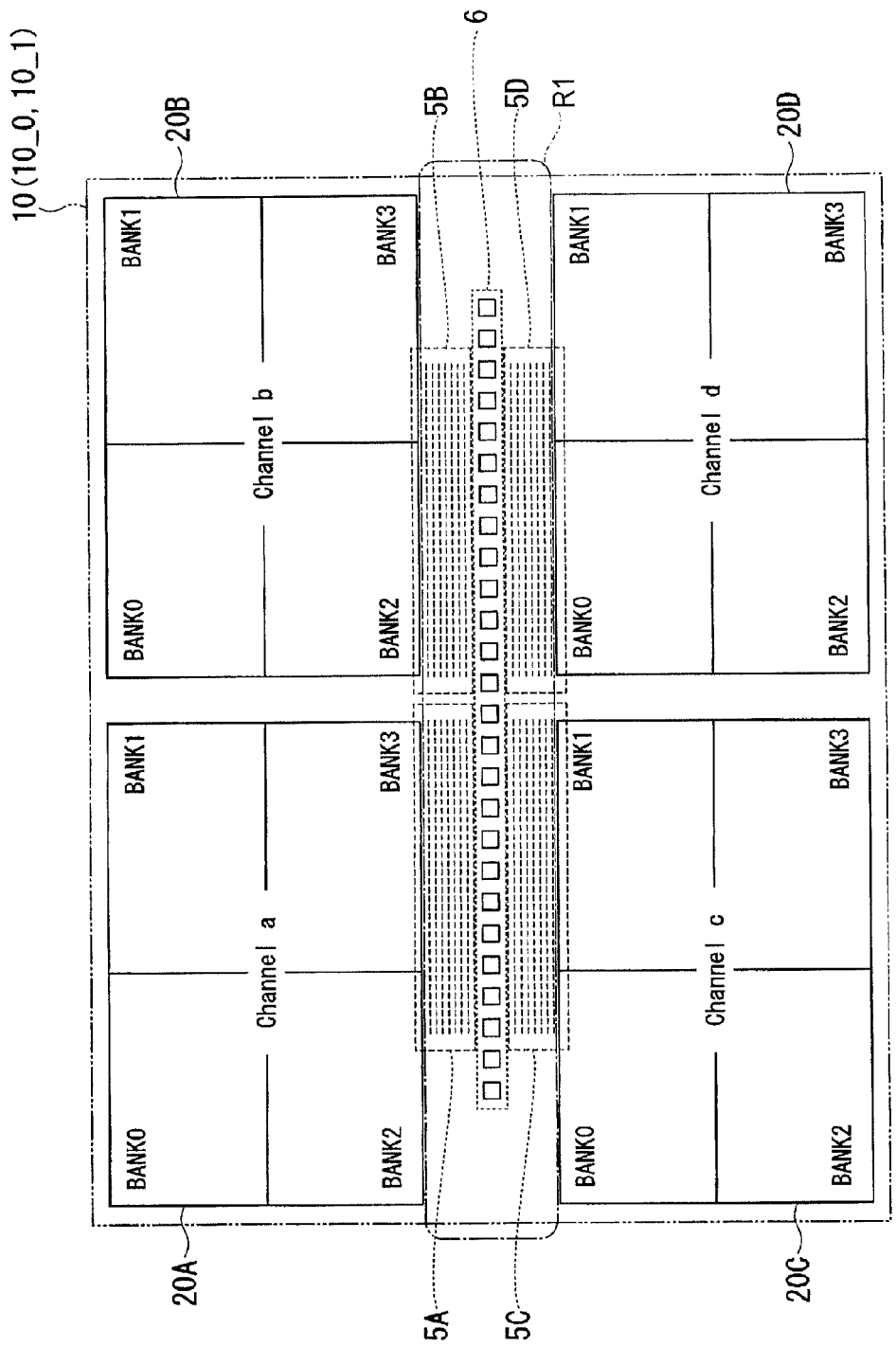
FIG. 2 is a schematic layout view indicative of an embodiment of a DRAM chip in the first embodiment.

Turning to FIG. 2, the "DRAM chip 10" refers to an arbitrary one of the DRAM chips 10_0 and 10_1 or simply refers to the DRAM chip provided in the semiconductor device 1.

FIG. 2 is a view of the DRAM chip 10 as viewed from the front surface F1 side of FIG. 1B. In FIG. 2, the DRAM chip 10 has four channels 20A to 20D (Channel a to Channel d), through electrodes 5 (5A to 5D), and test pads 6.

Each of the four channels 20A to 20D is a block functioning as an independent DRAM. That is, in the present embodiment, the DRAM chip 10 has four independent DRAMs (channels 20A to 20D). Each of the channels 20A to 20D has BANKs 0 to 3 each having memory cells of the DRAM. Hereinafter, "channel 20" refers to an arbitrary one of the four channels 20A to 20D or simply refers to the channel provided in the DRAM chip 10.

The plurality of through electrodes 5 and plurality of test pads 6 are disposed in a center area R1. The through electrodes 5 are divided into the through electrodes 5A to 5D (block a to block d) corresponding respectively to the channels 20A to 20D. The "through electrode 5" refers to an arbitrary one of the through electrodes 5A to 5D or simply refers to the through electrode provided in the semiconductor device 1.

The test pads 6 are each a pad (terminal) for connecting a probe needle when the DRAM 10 is tested in a wafer state. A pad size of each of the test pads 6 and an arrangement pitch of the test pads 6 are made larger than the size of each of the through electrodes 5A to 5D and arrangement pitch of the through electrodes 5A to 5D, respectively, so as to allow easy connection of the probe needle. Further, the use of the test pads 6 for testing the DRAM chip 10 further prevents the through electrodes 5A to 5D from being scratched.

Now, a configuration of the channel 20 in the DRAM chip 10 will be described.

As described above, the channel 20 is a block functioning as an independent DRAM. In the present embodiment, the DRAM chip 10 conforms to the Wide-IO standard that outputs 512 bits at a time. The DRAM chip 10 has the four channels 20 (20A to 20D), so that one channel 20 outputs 128 bits at a time.

Figure 3:
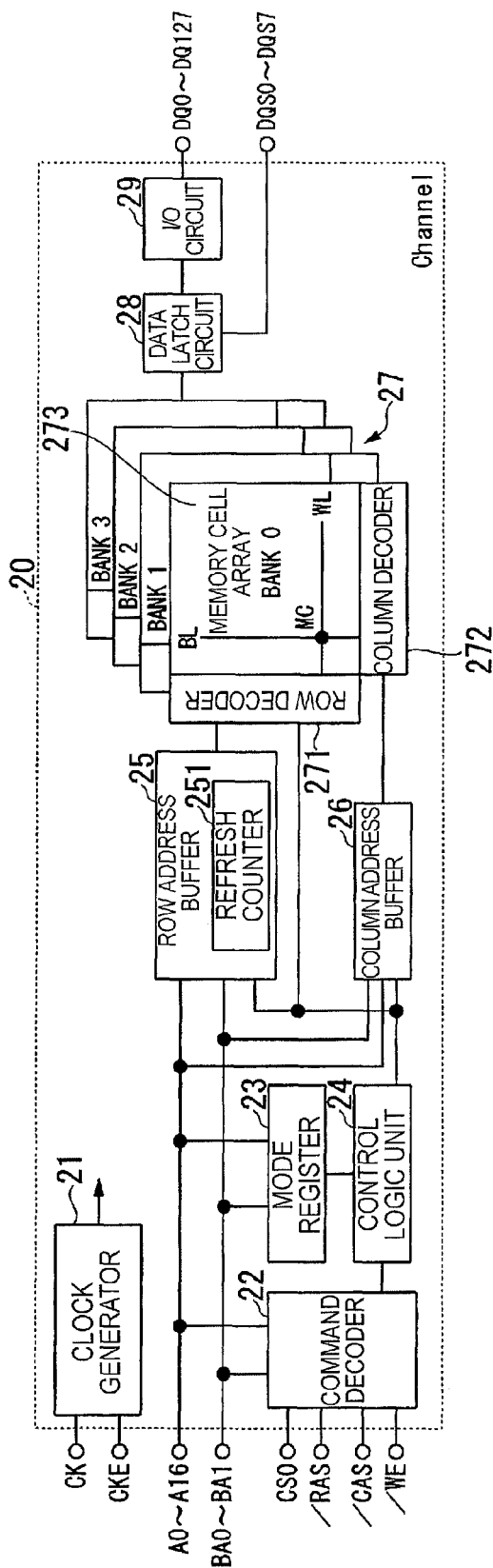
FIG. 3 is a block diagram indicative of a configuration of one of the channels shown in FIG. 2.

Turning to FIG. 3, the channel 20 has a clock generator 21, a command decoder 22, a mode register 23, a control logic unit 24, a row address buffer 25, a column address buffer 26, a memory unit 27, a data latch circuit 28, and an I/O (input/output) circuit 29. The channel 20 further has a plurality of signal terminals to/from which signals, such as a clock signal CK, a clock enable signal CKE, address signals A0 to A16 and BA0 to BA1, a chip select signal /CS, a row address strobe signal /RAS, a column address strobe signal /CAS, a write enable signal /WE, data strobe signals DQS0 to DQS7, and data signals DQ0 to DQ127 are input/output. The signals whose reference symbols begin with "/" each represent an inversion or low-active signal of the corresponding signal. Besides, although not illustrated, a power supply signal, a reset signal, and the like are supplied to the channel 20.

The clock signal CK and the clock enable signal CKE indicating whether the input clock signal CK is valid or not are input to the clock generator 21 from outside the DRAM chip 10. In response to the input clock signal CK and clock enable signal CKE, the clock generator 21 supplies an internal clock signal synchronized with the clock signal CK to the control logic unit 24 which is an internal circuit of the channel 20 and the like.

The chip select signal /CS, row address strobe signal /RAS, column address strobe signal /CAS, and write enable signal /WE as a command signal are input to the command decoder 22 from outside the DRAM chip 10. That is, the command signal is formed by a combination of the chip select signal /CS, row address strobe signal/RAS, column address strobe signal /CAS, and write enable signal /WE. The address signals A0 to A16 and bank address signals BA0 to BA1 as command information for the channel 20 to execute various internal commands are further input to the command decoder 22 from outside the DRAM chip 10. Based on the command signal and address signal A0 to A16 and BA0 to BA1, the command decoder 22 retains, decodes, and counts the command signal and command information to thereby generate various internal commands. The command decoder 22 supplies the generated internal command to the control logic unit 24.

The address signals A0 to A16 and bank address signals BA0 to BA1 as command mode information indicating a mode of the internal command are input to the mode register 23 from outside the DRAM chip 10. The mode register 23 retains the input command mode information and supplies the retained command mode information to the control logic unit 24.

The control logic unit 24 generates a control signal for executing various commands based on the internal command supplied from the command decoder 22 and command mode information supplied from the mode register 23. The various commands mentioned here include commands for writing/reading of data to/from the memory unit 27, making of configuration changes, executing various tests, and the like. The control logic unit 24 supplies the generated control signal to the row address buffer 25, column address buffer 26, and memory unit 27.

The row address buffer 25 retains, based on the control signal supplied from the control logic unit 24, a row address signal included in the address signals input as the address signals A0 to A16 and bank address signals BA0 to BA1. The row address buffer 25 supplies the retained row address signal to the memory unit 27. Further, the row address buffer 25 has a refresh counter 251.

The refresh counter 251 selects a word line (word line WL) for which refresh operation for data retention in the memory cell of the DRAM to execute the refresh operation. The refresh counter 251 executes the refresh operation based on a refresh signal (Ref signal) supplied from a refresh controller 40 (see FIG. 4) which is not illustrated here.

That is, a refresh period is defined by the refresh signal (Ref signal). The refresh period refers to a period at which the refresh operation is executed.

The column address buffer 26 retains, based on the control signal supplied from the control logic unit 24, a column address signal included in the address signals input as the address signals A0 to A16 and bank address signals BA0 to BA1. The column address buffer 26 supplies the retained column address signal to the memory unit 27.

The memory unit 27 has a plurality of memory blocks (e.g., BANK0 to BANK3), and each BANK has a row decider 271, a column decoder 272, and a memory cell array 273.

The row decoder 271 is a circuit which selects one of the plurality of word lines WL included in the memory cell array 273 based on the row address signal supplied from the row address buffer 25.

The column decoder 272 is a circuit which selects one of a plurality of bit lines BL included in the memory cell array 273 based on the column address signal supplied from the column address buffer 26.

The memory cell array 273 has the plurality of word lines WL, the plurality of bit lines BL, and a plurality of memory cells MC located at each of intersections of the word lines WL and the bit lines BL.

The memory cell array 273 further has a plurality of sense amplifiers each amplifying data read out from the memory cell MC onto the bit line BL, a plurality of word drivers driving the plurality of word lines, and a plurality of Y switches connecting the bit line BL and an IO line. The sense amplifier is a circuit which amplifies a weak data signal read out from the memory cell MC onto the bit line BL in readout operation. In writing operation, the sense amplifier is a circuit which writes data in the memory cell MC through the bit line BL. The memory cell array 273 supplies data read out from the memory cell MC to the data latch circuit 28. Further, the memory cell array 273 receives data to be written in the memory circuit MC from the data latch circuit 28.

The data latch circuit 28 latches readout data supplied from the memory unit 27 and supplies the latched data synchronously with the data strobe signals DQS0 to DQS7 to the I/O circuit 29 in readout operation. In writing operation, the data latch circuit 28 latches data supplied from the I/O circuit 29 based on the data strobe signals DQS0 to DQS7 and supplies the latched data to the memory unit 27 as write data.

Now, a configuration of the DRAM chip 10 having the above-described channel 20 will be described.

In the present embodiment, the DRAM chip 10 has four channels 20 (20A to 20D).

Figure 4:
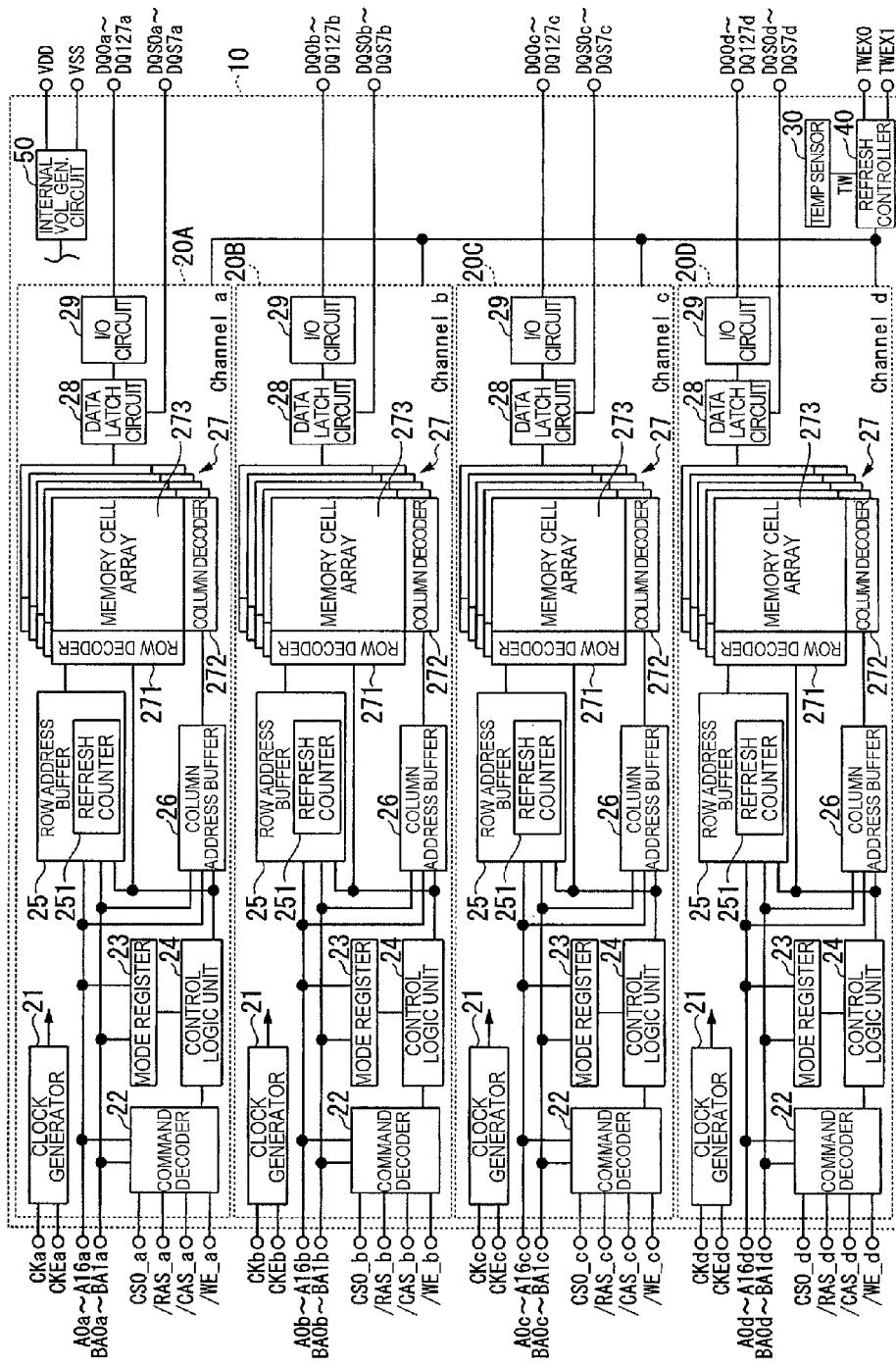
FIG. 4 is a block diagram indicative of a configuration of a DRAM chip in the first embodiment.

Turning to FIG. 4, the DRAM chip 10 has the four channels 20 (20A to 20D), a temperature sensor 30, a refresh controller 40, and an internal voltage generation circuit 50.

Each of the channels 20A to 20D (Channel a to Channel d) has the same configuration as that of the channel 20 described with reference to FIG. 3. The channel 20A has signal terminals corresponding respectively to a clock signal CKa, a clock enable signal CKEa, address signals A0a to A16a and BA0a to BA1a, a chip select signal CS0_a, a row address strobe signal /RAS_a, a column address strobe signal /CAS_a, a write enable signal /WE_a, a data strobe signals DQS0a to DQS7a, and data signals DQ0a to DQ127a.

Similarly, the channel 20B has signal terminals corresponding respectively to a clock signal CKb, a clock enable signal CKEb, address signals A0b to A16b and BA0b to BA1b, a chip select signal CS0_b, a row address strobe signal /RAS_b, a column address strobe signal /CAS_b, a write enable signal /WE_b, a data strobe signals DQS0b to DQS7b, and data signals DQ0b to DQ127b.

Similarly, the channel 20C has signal terminals corresponding respectively to a clock signal CKc, a clock enable signal CKEc, address signals A0c to A16c and BA0c to BA1c, a chip select signal CS0_c, a row address strobe signal /RAS_c, a column address strobe signal /CAS_c, a write enable signal /WE_c, a data strobe signals DQS0c to DQS7c, and data signals DQ0c to DQ127c.

Similarly, the channel 20D has signal terminals corresponding respectively to a clock signal CKd, a clock enable signal CKEd, address signals A0d to A16d and BA0d to BA1d, a chip select signal CS0_d, a row address strobe signal /RAS_d, a column address strobe signal /CAS_d, a write enable signal /WE_d, a data strobe signals DQS0d to DQS7d, and data signals DQ0d to DQ127d.

The internal voltage generation circuit 50 generates internal voltage to be used inside the DRAM chip 10 based on power supplies VDD and VSS supplied thereto from outside through power supply terminals and supplies the generated internal voltage to the components within the DRAM chip 10.

The temperature sensor 30 detects temperature in the DRAM chip 10 and outputs a result of the detection (output result) to the refresh controller 40. The temperature sensor 30 may be, e.g., a sensor that detects the temperature based on a variation in threshold voltage Vth of a transistor with respect to a temperature change or a sensor that detects the temperature based on a variation in a resistance value of a resistor element constituted by a semiconductor with respect to a temperature change.

The temperature sensor 30 outputs as the output result an H (High) state (first output state) when the temperature of the DRAM chip 10 in which the temperature sensor 30 is incorporated is equal to or higher than the predetermined threshold. On the other hand, when the temperature of the DRAM chip 10 is lower than the predetermined threshold, the temperature sensor 30 outputs as the output result an L (Low) state (second output state). That is, the temperature sensor 30 outputs the H state to an output signal TW when the temperature of the DRAM chip 10 is equal to or higher than the predetermined threshold and outputs the L state to the output signal TW when the temperature of the DRAM chip 10 is lower than the predetermined threshold.

For example, the temperature sensor 30 makes the output result to transit from the L state (second output state) to H state (first output result) when the temperature of the DRAM chip 10 in which the temperature sensor is incorporated changes from a low value to a value equal to or higher than the predetermined threshold.

An output result (TWEX1 signal) of the temperature sensor 30 (e.g., temperature sensor 30_1) incorporated in different (another) semiconductor chip (e.g., DRAM chip 10_1) to be described later is input to the refresh controller 40. Further, the refresh controller 40 generates a signal (TWEX0 signal) obtained by logically inverting an output result TW of the temperature sensor 30 (e.g., temperature sensor 30_0) incorporated in its own semiconductor chip (e.g., DRAM chip 10_0). The refresh controller 40 outputs the generated TWEX0 signal to another semiconductor chip. The refresh controller 40 supplies the refresh signal (Ref signal) serving as a reference for causing the refresh operation to be executed to the refresh counter 251 of each of the channels 20A to 20D.

The refresh controller 40 changes the refresh period of its own semiconductor chip depending on the output result (TWEX1 signal) of the temperature sensor 30_1 incorporated in another semiconductor chip. The refresh controller 40 changes the refresh period of its own semiconductor chip depending on the output result (TW) of the temperature sensor 30_0 incorporated in its own semiconductor chip. That is, the refresh controller 40 changes the period of the refresh signal (Ref signal) depending on the output result of the temperature sensor 30 incorporated in its own semiconductor chip or another semiconductor chip and supplies the resultant refresh signal (Ref signal) to the refresh counter 251 of each of the channels 20A to 20D of its own chip. The period of the refresh signal (Ref signal) mentioned here refers to a period in which an execution start timing (activation timing) of the refresh operation is generated.

When the output result of the temperature sensor 30 assumes the H state (first output state), the refresh controller 40 changes the refresh period to a period shorter than that set in the case where the output result of the temperature sensor 30 assumes the L state (second output state). In other words, when the output result of the temperature sensor 30 assumes the L state (second output state), the refresh controller 40 changes the refresh period up to a period longer than that set in the case where the output result of the temperature sensor 30 assumes the H state (first output state).

A detailed configuration of the refresh controller 40 will be described later with reference to FIG. 5.

In the present embodiment, the above-mentioned various signal and power supply terminals provided in the DRAM chip 10 are formed by the through electrodes 5 described in FIGS. 1 and 2. Thus, in the semiconductor device 1, the various signal and power supply terminals are connected to each other between a plurality of semiconductor chips (e.g., DRAM chips 10_0 and 10_1) through the through electrodes. For example, in the semiconductor device 1, the temperature sensor 30 (e.g., temperature sensor 30_1) and the refresh controller 40 (e.g., refresh controller 40_0) are connected to each other through the through electrode between a plurality of semiconductor chips (e.g., DRAM chips 10_0 and 10_1).

Now, a configuration of the semiconductor device 1 in the present embodiment having the plurality of above-described DRAM chips 10 will be described.

Figure 5:
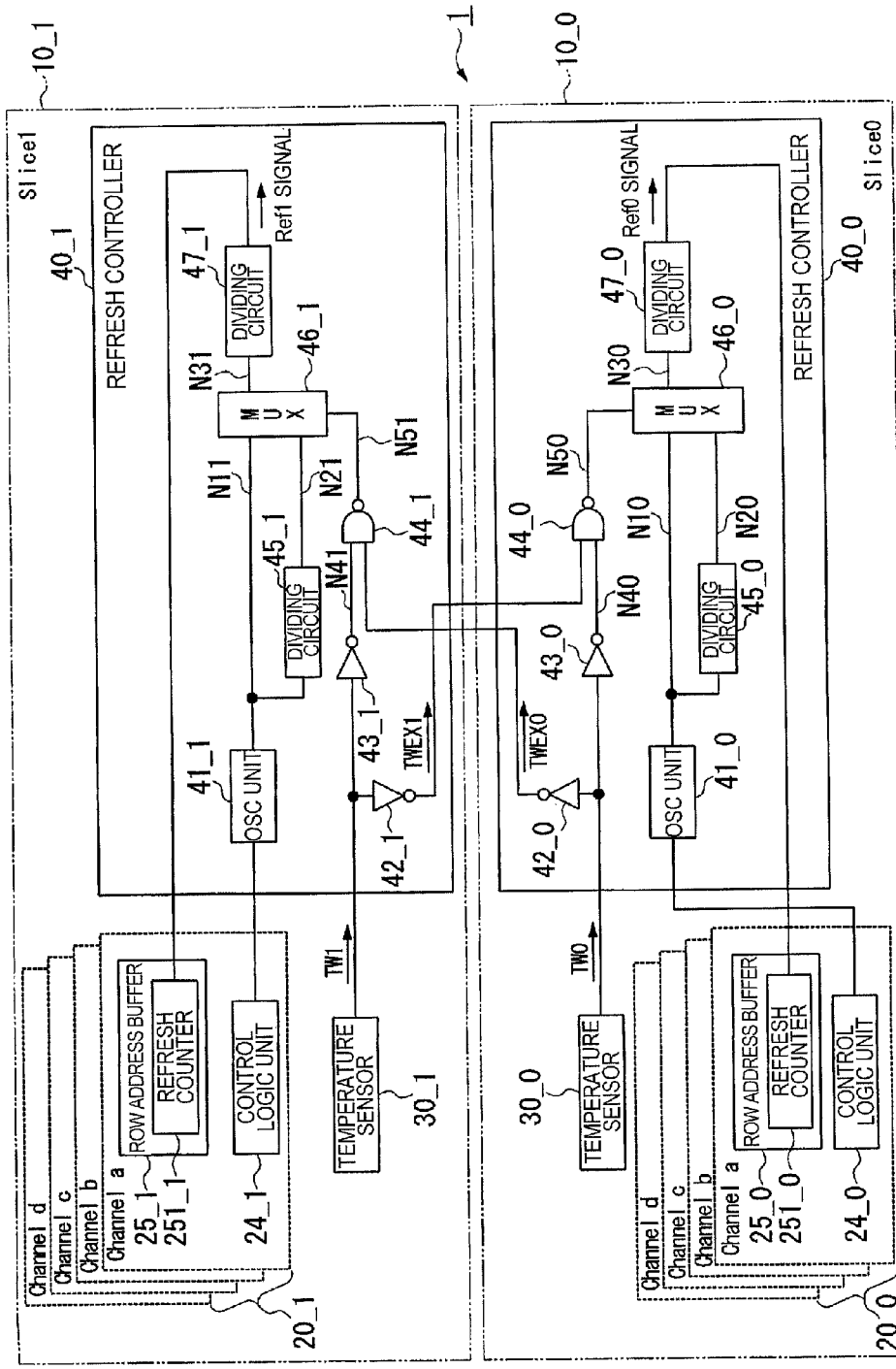
FIG. 5 is a block diagram indicative of a configuration of the semiconductor device in the first embodiment.

Turning to FIG. 5, the semiconductor device 1 has two DRAM chips 10 (10_1, 10_2). Although omitted in FIG. 5, the semiconductor device 1 further has the SOC chip 11.

The DRAM chip 10_0 (Slice 0) and DRAM chip 10_1 (Slice 1) each have the same configuration as that of the above-described DRAM chip 10.

In FIG. 5, the channel 20 (20A to 20D), temperature sensor 30, and refresh controller 40 provided in the DRAM chip 10_0 are referred to respectively as "channel 20_", "temperature sensor 30_0", and "refresh controller 40_0". Further, the control logic unit 24, row address buffer 25, and refresh counter 251 provided in the channel 20_0 are referred to respectively as "control logic unit 24_0", "row address buffer 25_0", and "refresh counter 251_0".

Similarly, the channel 20 (20A to 20D), temperature sensor 30, and refresh controller 40 provided in the DRAM chip 10_1 are referred to respectively as "channel 20_1", "temperature sensor 30_1", and "refresh controller 40_1". Further, the control logic unit 24, row address buffer 25, and refresh counter 251 provided in the channel 20_1 are referred to respectively as "control logic unit 24_1", "row address buffer 25_1", and "refresh counter 251_1".

The refresh controller 40_0 has an OSC (Oscillator) unit 41_0, inverter circuits 42_0 and 43_0, a NAND circuit 44_0, dividing circuits 45_0 and 47_0, and a multiplexer 46_0.

The OSC unit 41_0 is, e.g., an oscillating circuit and generates a clock signal for generating a refresh signal (Ref0 signal) to be supplied to the channel 20_0 based on an internal refresh command signal supplied from the control logic unit 24_0. The OSC unit 41_0 outputs the generated clock signal to a node N10 and then supplies the clock signal to the dividing circuit 45_0 and multiplexer 46_0 through the node N10. The refresh operation of the channel 20_0 is activated.

The dividing circuit 45_0 frequency-divides the clock signal supplied from the OSC unit 41_0 to generate a clock signal having a longer period (lower frequency) than that of the clock signal generated by the OSC unit 41_0. The dividing circuit 45_0 outputs the generated clock signal to a node N20 and supplies the clock signal to the multiplexer 46_0 through the node N20.

The inverter circuit 42_0 generates the signal (TWEX0 signal) obtained by logically inverting an output signal representing the detection result (output result) output from the temperature sensor 30_0 and outputs the generated TWEX0 signal outside the DRAM chip 10_0. In the present embodiment, the inverter circuit 42_0 supplies the generated TWEX0 signal to the refresh controller 40_1 of the DRAM chip 10_1 through the through electrode 5. For example, the temperature sensor 30_0 makes an output signal TW0 to transit from the L state (second output state) to H state (first output result) when the temperature of the DRAM chip 10 changes from a low value to a value equal to or higher than the predetermined threshold. In this case, the inverter circuit 42_0 makes the TWEX0 signal to transit from the H state to L state.

The inverter circuit 43_0 generates a signal obtained by logically inverting the output signal TW0 representing the detection result (output result) output from the temperature sensor 30_0 and outputs the generated signal to a node N40. The signal generated by the inverter circuit 43_0 represents the same logical state as that of the TWEX0 signal.

The NAND circuit 44_0 is a negative AND circuit. The NAND circuit 44_0 outputs a signal obtained by performing NAND operation between the logically inverted signal of the output signal TW0 supplied from the inverter circuit 43_0 through the node N40 and the TWEX1 signal supplied from the DRAM chip 10_1 through the through electrode 5 to a node N50. The NAND circuit 44_0 supplies, as a select signal, the output signal obtained by NAND operation to the multiplexer 46_0 through the node N50. That is, the NAN circuit 44_0 supplies a signal obtained by performing NAND operation between a signal corresponding to the TWEX0 signal and TWEX1 signal to the multiplexer 46_0 as a select signal for the multiplexer 460.

For example, when one or both of the signal corresponding to the TWEX0 signal and TWEX1 signal are L state, the NAND circuit 44_0 outputs the H state to the select signal; when both of the signal corresponding to the TWEX0 signal and TWEX1 signal are H state, the NAN circuit 44_0 outputs the L state to the select signal.

The multiplexer 46_0 (MUX), outputs, based on the select signal supplied from the NAND circuit 44_0, one of the clock signal supplied through the node N10 and the clock signal supplied through the node N20 to a node N30. That is, the multiplexer 46_0 supplies one of the clock signal generated by the OSC unit 41_0 and the clock signal frequency-divided by the dividing circuit 45_0 to the dividing circuit 47_0 through the node N30.

For example, when the select signal assumes the L state, the multiplexer 46_0 supplies the clock signal frequency-divided by the dividing circuit 45_0 having a longer period (lower frequency) than that of the clock signal generated by the OSC unit 41_0 to the dividing circuit 47_0. On the other hand, when the select signal assumes the H state, the multiplexer 46_0 supplies the clock signal generated by the OSC unit 41_0 having a shorter period (higher frequency) than that of the clock signal frequency-divided by the dividing circuit 45_0 to the dividing circuit 47_0.

The dividing circuit 47_0 frequency-divides the clock signal supplied from the multiplexer 46_0 and supplies the frequency-divided clock signal to the refresh counter 251_0 of the channel 20_0 as the refresh signal (Ref0 signal). For example, in the refresh signal (Ref0 signal), a rising edge at which a signal state transits from the L state to H state represents the execution start timing (activation timing) of the refresh operation.

As described above, the refresh controller 40_0 changes the refresh period of the DRAM chip 10_0 (its own semiconductor chip) in which the refresh controller 40_0 is incorporated depending on the output result (TW1 or TWEX1) of the temperature sensor 30_1 incorporated in the DRAM chip 10_1 (another semiconductor chip).

Further, when at least one of the output results TW0 and TW1 of the two temperature sensors 30_0 and 30_1 assumes the H state, the refresh controller 40_0 changes the refresh period to a period shorter than that set in the case where both the output results TW0 and TW1 of the temperature sensors 30_0 and 30_1 assume the L state. The two temperature sensors mentioned here refer to the temperature sensor 30_0 incorporated in the DRAM chip 10_0 in which the refresh operation is executed and the temperature sensor 30_1 incorporated in the DRAM chip 10_1 which is a different semiconductor chip from the DRAM chip 10_0.

In FIG. 5, the refresh controller 40_1 has the same configuration as that of the refresh controller 40_0. The refresh controller 40_1 has an OSC unit 411, inverter circuits 42_1 and 43_1, a NAND circuit 44_1, dividing circuits 45_1 and 47_1, and a multiplexer 46_1. The OSC unit 41_1, inverter circuits 42_1 and 43_1, NAND circuit 44_1, dividing circuits 45_1 and 47_1, and multiplexer 46_1 correspond respectively to the OSC unit 41_0, inverter circuits 42_0 and 43_0, NAND circuit 44_0, dividing circuits 45_0 and 47_0, and multiplexer 46_0 in the refresh controller 40_0. Further, the above-described node N10, node N20, node N30, node N40 and node N50 correspond respectively to a node N11, a node N21, a node N31, a node N41, and a node N51. Further, the above-described outputs signals TW0 and TWEX0 correspond respectively to the output signals TW1 and TWEX1, and the above-described refresh signal (Ref0 signal) corresponds to a refresh signal (Ref1 signal).

Now, operation of the semiconductor device 1 in the present embodiment will be described.

Figure 6:
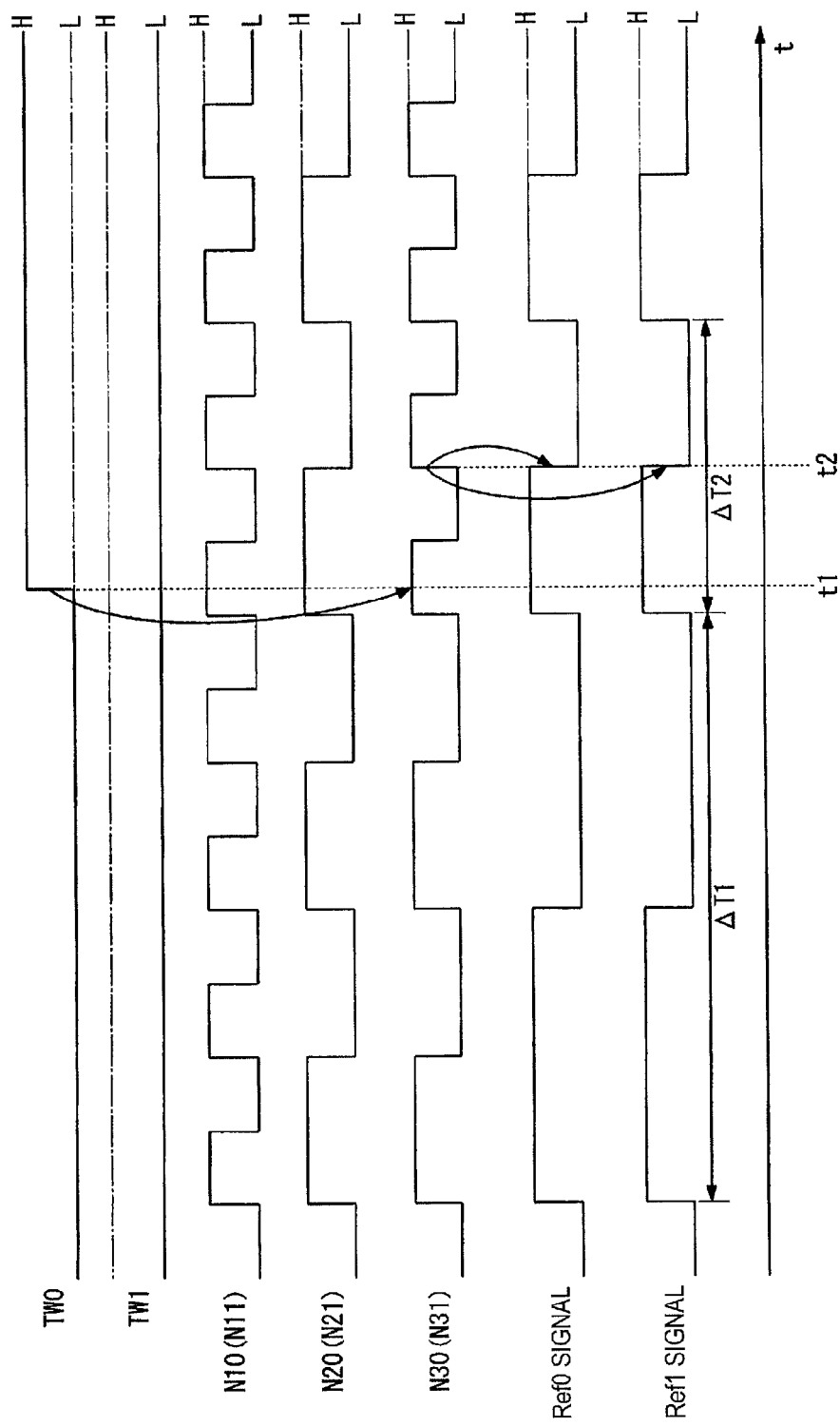
FIG. 6 is a timing chart indicative of an operation of a refresh controller shown in FIGS. 5 and 6.

Turning to FIG. 6, a vertical axis represents, from top to bottom, the output signal TW0, output signal TW1, signal at node N10 (N11), signal at node N20 (N21), signal at node N30 (N31), Ref0 signal, and Ref1 signal. A horizontal axis represents time t.

The timing chart of FIG. 6 illustrates a case where the temperature sensor 30_0 incorporated in the DRAM chip 10_0 detects a temperature equal to or higher than the predetermined threshold at time t1.

Before time t1, both the output signal TW0 of the temperature sensor 30_0 and output signal TW1 of the temperature sensor 30_1 output the L state. In this case, the multiplexer 46_0 (46_1) outputs the low frequency clock signal (signal at the node N20 (N21)) frequency-divided by the dividing circuit 45_0 (45_1) to the node N30 (N31). Thus, as the Ref0 signal and Ref1 signal, refresh signals having a long period (ΔT1) corresponding to the case where the temperature is lower than the predetermined threshold are output.

When the temperature sensor 30_0 detects a temperature equal to or higher than the predetermined threshold to make the output signal TW0 to transit from the L state to H state at time t1, the NAND circuit 44_0 (44_1) outputs the H state to the select signal. Since the select signal is the H state, the multiplexer 46_0 (46_1) outputs the high frequency clock signal (signal at the node N10 (N11)) generated by the OSC unit 41_0 (41_1) to the node N30 (N31) (see time t2). Thus, as the Ref0 signal and Ref1 signal, refresh signals having a short period (ΔT2) corresponding to the case where the temperature is equal to or higher than the predetermined threshold are output.

As described above, the refresh controller 40_0 and refresh controller 40_1 change the Ref0 signal and Ref1 signal from a signal having a long period (ΔT1) to a signal having a short period (ΔT2) when the temperature of the DRAM chip 10_0 is increased to a high temperature (e.g., a temperature equal to or higher than the predetermined threshold). Accordingly, the refresh counter 251_0 of the channel 20_0 and refresh counter 251_1 of the channel 20_1 execute the refresh operation with the short period (ΔT2) based respectively on the Ref0 signal and Ref1 signal.

Note that operation to be performed when the temperature sensor 30_1 incorporated in the DRAM chip 10_1 detects a temperature equal to or higher than the predetermined threshold (i.e., when the output signal TW1 assumes the H state) is the same as that illustrated in FIG. 6.

As described above, the semiconductor device 1 in the present embodiment has the plurality of semiconductor chips (e.g., DRAM chips 10_0 and 10_1 and SOC chip 11) and changes the refresh period of the DRAM chip 10_0 depending on the output result of the temperature sensor 30_1 incorporated in at least one (e.g., DRAM chip 10_1) of the plurality of semiconductor chips different from the DRAM chip 10_0 in which the refresh operation is executed. That is, the semiconductor device 1 has a plurality of semiconductor chips including at least one semiconductor chip (e.g., DRAM chip 10_0) requiring the refresh operation. The semiconductor device 1 changes, depending on the output result of the temperature sensor 30_1 (first temperature sensor) incorporated in at least one first semiconductor chip (e.g., DRAM chip 10_1) of the plurality of semiconductor chips, the refresh period of the DRAM chip 10_0 (second semiconductor chip) different from the DRAM chip 10_1 (first semiconductor chip) out of the plurality of semiconductor chips. The first semiconductor chip mentioned here refers to a semiconductor chip which is different from the second semiconductor chip in which the refresh operation is executed and which has the temperature sensor 30 (first temperature sensor).

In other words, the semiconductor device 1 has a plurality of semiconductor chips including a semiconductor chip requiring the refresh operation and changes the refresh period at which the refresh operation of the second semiconductor chip different from the first semiconductor chip is executed depending on the output result of the first temperature sensor incorporated in the first semiconductor chip. To summarize this: the first semiconductor chip of the plurality of the semiconductor chips provided in the semiconductor device 1 is a semiconductor device having the first temperature sensor; the second semiconductor chip thereof different from the first semiconductor chip is a semiconductor chip requiring the refresh operation; and the refresh period of the second semiconductor chip is changed depending on the output result of the first temperature sensor of the first semiconductor chip.

Thus, the temperature of the DRAM chip 10_1 in which the temperature sensor 30_1 is incorporated is detected accurately to change the refresh period of the DRAM chip 10_0, thereby preventing the refresh period of the DRAM chip 10_0 from being changed unnecessarily. As a result, it is possible to eliminate wasted current consumption in the semiconductor device 1.

Further, in the present embodiment, the semiconductor device 1 has the refresh controller 40_0 that changes the refresh period of the DRAM chip 10_0 depending on the output result of the temperature sensor 30_1 (first temperature sensor) incorporated in the DRAM chip 10_1 (at least one semiconductor chip different from the DRAM chip 10_0). For example, the DRAM chip 10_0 (second semiconductor chip) has the refresh controller 40_0 that controls the refresh period of the DRAM chip 10_0 in response to the output result of the temperature sensor 30_1 (first temperature sensor).

The refresh controller 40_0 accurately detects the temperature of the DRAM chip 10_1 in which the temperature sensor 30_1 is incorporated and changes the refresh period of the DRAM chip 10_0. Thus, the refresh controller 40_0 can prevent the refresh period of the DRAM chip 10_0 from being changed unnecessarily. As a result, it is possible to eliminate wasted current consumption in the semiconductor device 1.

Further, in the present embodiment, the temperature sensor 30 outputs the H state (first output state) as the output result when the temperature of the semiconductor chip (e.g., DRAM chip (10_0, 10_1)) in which the temperature sensor 30 itself is incorporated is equal to or higher than the predetermined threshold. Further, the temperature sensor 30 outputs the L state (second output state) when the temperature of the semiconductor chip in which the temperature sensor 30 itself is incorporated is lower than the predetermined threshold. Further, when the output result of the temperature sensor 30 assumes the H state, the refresh controller 40 changes the refresh period to a period shorter than that set in the case where the output result of the temperature sensor 30 assumes the L state.

Thus, in the semiconductor device 1, the refresh period is reduced when the temperature of the DRAM chip (10_0, 10_1) is increased to a high temperature (temperature equal to or higher than the predetermined threshold), thereby preventing a failure from occurring in the DRAM chip (10_0, 10_1).

Further, in the present embodiment, the DRAM chip 10_0 (10_1) which is the second semiconductor chip in which the refresh operation is executed has a second temperature sensor (e.g., temperature sensor 30_0 (30_1)). The refresh controller 40_0 (40_1) changes the refresh period based on the output results of the two or more (e.g., two) temperature sensors 30 including the temperature sensor 30_0 (30_1) incorporated in the DRAM 10_0 (10_1) and the first temperature sensor (e.g., temperature sensor 30_1 (30_0)) incorporated in different DRAM chip 10_1 (10_0). For example, the refresh controller 40_0 (40_1) reduces the refresh period of the DRAM chip 10_0 (10_1) when at least one of the output results of the two or more temperature sensors (30_0, 30_1) assumes the H state. The reduced (or short) period of the refresh period refers to a period shorter than that set in the case where all the output results of the two or more temperature sensors (e.g., temperature sensors 30_0 and 30_1) assume the L state. That is, when at least one of the output results of the temperature sensors 30_0 and 30_1 assumes the H state, the refresh controller 40_0 (40_1) changes the refresh period of the DRAM chip 10_0 (10_1) to a period shorter than that set in the case where both the output results of the temperature sensors 30_0 and 30_1 assume the L state.

Thus, the DRAM chip 10_0 (10_1) can reduce the refresh period in the wake of detection of increased temperature of another semiconductor device provided in the semiconductor device 1, thereby reducing the refresh period before the temperature of its own semiconductor chip is increased to a high temperature. Further, the DRAM chip 10_0 (10_1) can reduce the refresh period not only when the temperature of another semiconductor chip provided in the semiconductor device 1 has been increased to a high temperature, but also when the temperature of its own semiconductor chip has been increased to a high temperature. Thus, in the semiconductor device 1, occurrence of a failure in the DRAM chip (10_0, 10_1) can be prevented.

Further, in the present embodiment, the second semiconductor chip (e.g., DRAM 10_0) further has the second temperature sensor (e.g., temperature sensor 30_0), and the refresh period of the second semiconductor chip is changed depending on the output results of the first and second temperature sensors (temperature sensors 30_0 and 30_1). The first semiconductor chip (e.g., DRAM 10_1) is a semiconductor chip requiring the refresh operation, and the refresh period at which the refresh operation of the first semiconductor is executed is also changed depending on the output results of the first and second sensors (temperature sensors 30_0 and 30_1).

Thus, the first semiconductor chip (e.g., DRAM 10_1) and second semiconductor chip (e.g., DRAM 10_0) share the detection results obtained by each other, so that the temperature in the semiconductor device 1 can be detected accurately so as to change the refresh period. This allows the refresh controller 40 (40_0, 40_1) to prevent the refresh period of the DRAM chip 10_0 from being changed unnecessarily. As a result, it is possible to eliminate wasted current consumption in the semiconductor device 1.

Further, in the present embodiment, the DRAM chip 10 (second semiconductor chip) in which the refresh operation is executed has the temperature sensor 30 and refresh controller 40. The plurality of semiconductor chips include the plurality of (e.g., two) DRAM chips 10 (second semiconductor chips 10_0 and 10_1). The second semiconductor chips refer to semiconductor chips in which the refresh operation is executed. When at least one of the output results of the temperature sensors 30 (30_0, 30_1) incorporated in the plurality of DRAM chips 10_0 and 10_1 assumes the H state, the refresh controller 40 changes the refresh period of its own semiconductor chip to a period shorter than that set in the case where both the output results of the temperature sensors 30 (30_0, 30_1) assume the L state.

For example, assuming that its own semiconductor chip is the DRAM 10_0, the second temperature sensor incorporated in its own semiconductor chip corresponds to the temperature sensor 30_0. In this case, the second semiconductor chip (DRAM chip 10_1) different from its own semiconductor chip corresponds to the above-described first semiconductor chip, and the second temperature sensor (in this case, which is also the first temperature sensor) incorporated in the DRAM chip 10_1 corresponds to the temperature sensor 30_1. That is, when at least one of the output results of the temperature sensors 30_0 and 30_1 assumes the H state, the refresh controller 40 changes the refresh period of its own semiconductor chip to a period shorter than that set in the case where both the output results of the temperature sensors 30_0 and 30_1 assume the L state.

Thus, the refresh controllers 40 (40_0, 40_1) share the detection results obtained by the temperature sensors 30 (30_0, 30_1) of the plurality of DRAM chips 10_0 and 10_1, so that the temperature in the semiconductor device 1 can be detected accurately. The refresh controllers 40 (40_0, 40_1) detect the temperature in the semiconductor device 1 accurately and change the refresh periods of the DRAM chips 10_0 and 10_1, respectively. This allows the refresh controllers 40 (40_0, 40_1) to prevent the refresh period of the DRAM chip 10_0 from being changed unnecessarily. As a result, it is possible to eliminate wasted current consumption in the semiconductor device 1.

Further, sharing the detection results obtained by the temperature sensors 30 (30_0, 30_1) between the plurality of DRAM chips 10_0 and 10_1 allows a reduction in the refresh period before the temperature of each semiconductor chip is increased to a high temperature. Thus, in the semiconductor device 1, occurrence of a failure in the DRAM chip (10_0, 10_1) can be prevented.

Further, the semiconductor device 1 in the present embodiment has the package substrate 3 on which the DRAM chips 10_0 and 10_1 and SOC chip 11 (collectively referred to as plurality of semiconductor chips) are mounted. The plurality of semiconductor chips (DRAM chips 10_0 and 10_1 and SOC chip 11) and the package substrate 3 are encapsulated by the same encapsulation resin 4. Further, the plurality of semiconductor chips (DRAM chips 10_0 and 10_1 and SOC chip 11) each have the through electrodes 5 penetrating therethrough from the front surface F1 (first surface) to the rear surface F2 (second surface) which are opposed to each other to electrically conduct the front surface electrode 55 (electrode terminal) formed on the front surface F1 and rear surface electrode 51 (electrode terminal) formed on the rear surface F2. That is, DRAM chips 10_0 and 10_1 and SOC chip 11 each have the through electrodes penetrating therethrough for electrical conduction. The temperature sensors 30 and refresh controllers 40 of one semiconductor chip are connected to those of the other semiconductor chip through the through electrodes. That is, signal lines including at least the output result of the first temperature sensor are connected to each other between the plurality of semiconductor chips through the through electrodes.

Thus, the semiconductor device 1 having the plurality of semiconductor chips and capable of eliminating wasted current consumption while preventing occurrence of a failure in the DRAM chip (10_0, 10_1) can be provided in a packaged configuration.

Now, a semiconductor device according to a second embodiment will be described with reference to FIG. 7.

Second Embodiment

Figure 7:
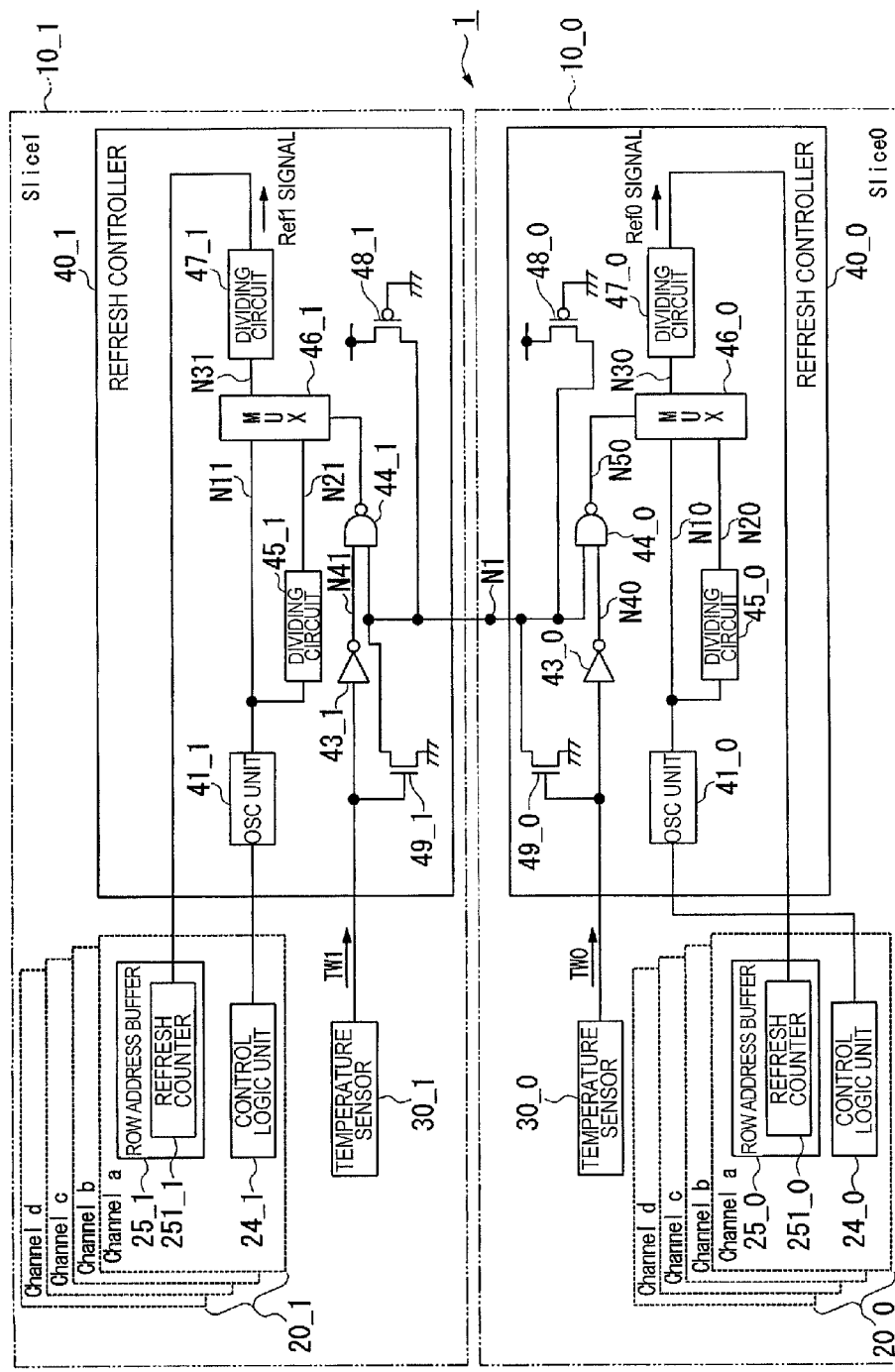
FIG. 7 is a block diagram indicative of a configuration of a semiconductor device according to a second embodiment of the present invention.

In FIG. 7, the same reference numerals are given to the same elements as those of FIG. 5, and the explanation is not repeated.

In the present embodiment, a configuration in which the output result of a temperature sensor 30_0 and output result of a temperature sensor 30_1 are shared between the DRAM chips 10_0 and 10_1 by using a single signal line will be described.

In the present embodiment, the refresh controller 40_0 has an OSC unit 41_0, an inverter circuit 43_0, a NAND circuit 44_0, dividing circuits 45_0 and 47_0, a multiplexer 46_0, a PMOS transistor (p-channel metal-oxide semiconductor field-effect transistor) 48_0, and an NMOS transistor (n-channel metal-oxide semiconductor field-effect transistor) 49_0.

The PMOS transistor 48_0 has a source terminal connected to a drive power supply, a gate terminal connected to a ground power supply, and a drain terminal connected to a node N1. When the source terminal and drain terminal are in a conductive state, the PMOS transistor 48_0 is electrically connected to the node N1 by high resistance. Thus, although the PMOS transistor 48_0 is always in a conductive state since the gate electrode is connected to the ground power supply, it functions as a pull-up resistor due to establishment of electrical connection to the node N1 by the high resistance.

The NMOS transistor 49_0 has a source terminal connected to a ground power supply, a gate terminal connected to a signal line of an output signal (TW0) of the temperature sensor 30_0, and a drain terminal connected to the node N1. The NMOS transistor 49_0 functions as an open-drain output transistor that outputs a Hi-Z state or an L state to the node N1. For example, the NMOS transistor 49_0 outputs the Hi-Z state to the node N1 when the output signal (TW0) of the temperature sensor 30_0 is the L state and outputs the L state to the node N1 when the output signal (TW0) of the temperature sensor 30_0 is the H state.

Further, in the present embodiment, the NAND circuit 44_0 is connected not with an output signal line of the inverter circuit 42_1, but with the node N1.

In FIG. 7, the refresh controller 40_1 has the same configuration as that of the above-described refresh controller 40_0. In the refresh controller 40_1, a PMOS transistor 48_1 and an NMOS transistor 49_1 are connected to the node N1 like the PMOS transistor 48_0 and NMOS transistor 49_0. Further, an NAND circuit 441 is connected not with an output signal line of the inverter circuit 42_0, but with the node N1.

As described above, in the present embodiment, the refresh controllers 40_0 and 40_1 are connected through the node N1. The node N1 connects the refresh controllers 40_0 and 40_1 through the above-described through electrode 5.

Now, operation of the refresh controller 40 (40_0, 40_1) in the present embodiment will be described.

Operation of the refresh controller 40 (40_0, 40_1) in the present embodiment is basically the same as that in the first embodiment but differs from the first embodiment in that the refresh controllers 40_0 and 40_1 are connected to a single signal line (node N1). Here, operation concerning the node N1 will be described.

The node N1 is connected with the PMOS transistors 48_0 and 48_1 each functioning as the pull-up transistor and the NMOS transistors 49_0 and 49_1 each functioning as the open-drain output transistor.

For example, when both the output signal TW0 of the temperature sensor 30_0 and output signal TW1 of the temperature sensor 30_1 assume the L state, the NMOS transistors 49_0 and 49_1 are in a non-conductive state, and the node N1 is kept at the H state. For example, when the output signal TW0 of the temperature sensor 30_0 assumes the H state, the NMOS transistor 49_0 is in a conductive state, and the node N1 assumes the L state. For example, when the output signal TW1 of the temperature sensor 30_1 assumes the H state, the NMOS transistor 49_1 is in a conductive state, and the node N1 assumes the L state. That is, both or one of the output signal TW0 of the temperature sensor 30_0 and output signal TW1 of the temperature sensor 30_1 assume the H state, the node N1 assumes the L state. When the node N1 assumes the L state, the refresh controller 40 (40_0, 40_1) reduces the refresh period.

As described above, the semiconductor device 1 in the present embodiment can change the refresh period, as with the semiconductor device 1 of the first embodiment, thereby obtaining the same effects as those in the first embodiment.

Further, the semiconductor device 1 in the present embodiment can share the output results of the temperature sensors 30 incorporated in the plurality of semiconductor chips between the semiconductor chips by the single signal line (node N1), thereby reducing the number of the though electrodes 5.

Now, a semiconductor device according to a third embodiment will be described with reference to FIG. 8.

Third Embodiment

Figure 8:
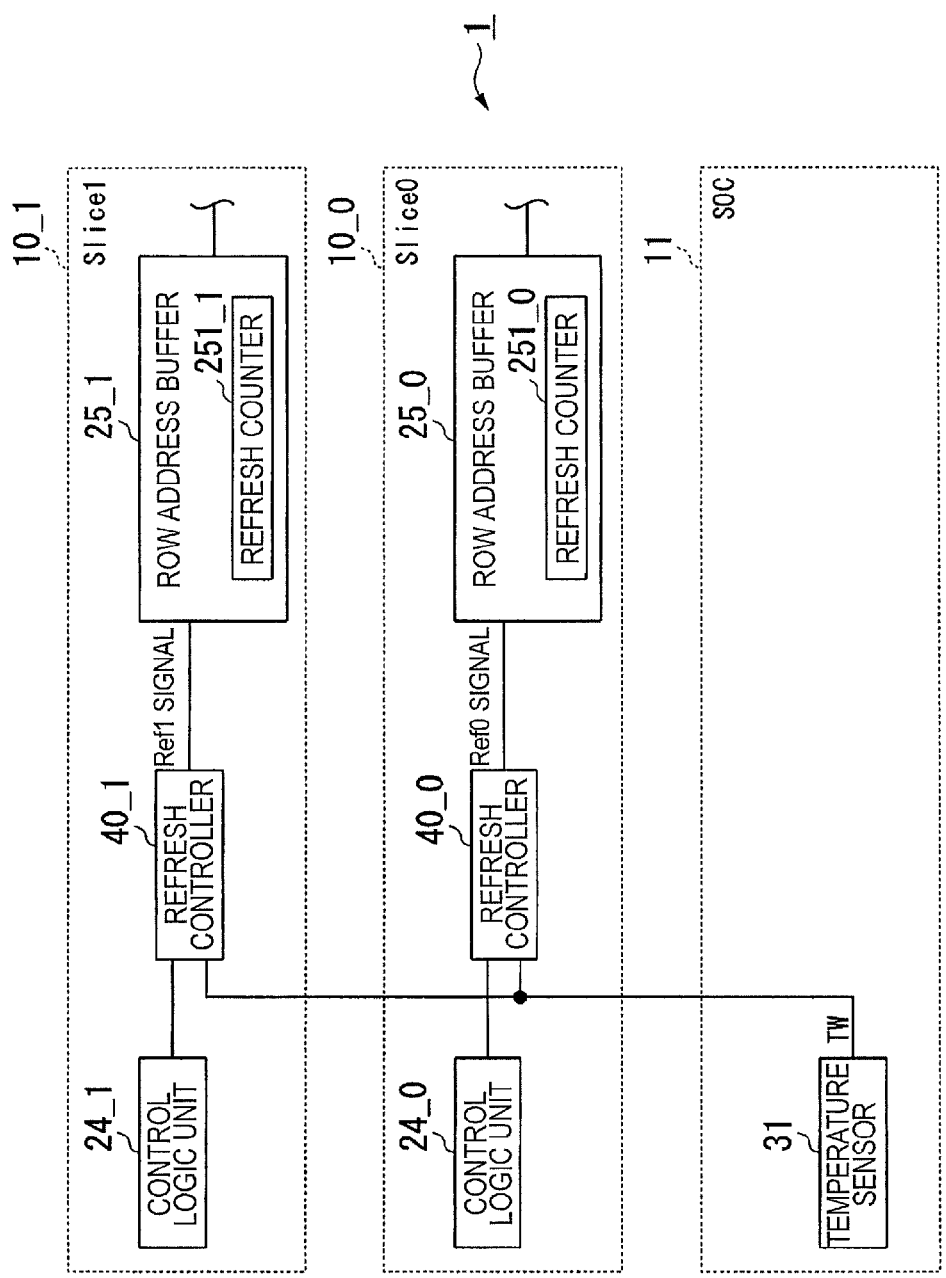
FIG. 8 is a block diagram indicative of a configuration of the semiconductor device according to a third embodiment of the present invention.

Turning to FIG. 8, the semiconductor device 1 has the DRAM chips 10 (10_0, 10_1) and SOC chip 11.

In the present embodiment, the DRAM chips 10 (10_0, 10_1) which are the first semiconductors each have the refresh controller 40, control logic unit 24, and row address buffer 25. That is, the DRAM chip 10_0 has the refresh controller 40_0, control logic unit 24_0, and row address buffer 25_0, and the DRAM chip 10_1 has the refresh controller 40_1, control logic unit 24_1, and row address buffer 25_1.

The SOC chip 11 (third semiconductor chip) is a controller controlling, e.g., the DRAM chip 10 and has a temperature sensor 31. The SOC chip 11 is also a control chip that outputs address signals and command signals to the DRAM chip 10.

The temperature sensor 31 has the same configuration as that of the temperature sensor 30 in the first and second embodiments.

In the present embodiment, the refresh controller 40 (40_0, 40_1) changes the refresh period of the DRAM chip (10_0, 10_1) depending on the output result (TW) of the temperature sensor 31 provided in the SOC chip 11.

For example, in the DRAM chip 10_0, the refresh controller 40_0 starts output of the refresh signal (Ref0 signal) based on the internal refresh command signal supplied from the control logic unit 24_0. For example, when the temperature of the SOC chip 11 is increased to a high temperature to cause the temperature sensor 31 outputs the H state, the refresh controller 40_0 reduces the refresh period (Ref0 signal) and supplies the reduced refresh signal (Ref 0 signal) to the refresh counter 251_0 of the row address buffer 25_0. The refresh counter 251_0 starts the refresh operation based on the reduced refresh signal (Ref0 signal) supplied from the refresh controller 40_0.

Similarly, for example, in the DRAM chip 10_1, the refresh controller 40_1 starts output of the refresh signal (Ref1 signal) based on the internal refresh command signal supplied from the control logic unit 24_1. For example, when the temperature of the SOC chip 11 is increased to a high temperature to cause the temperature sensor 31 outputs the H state, the refresh controller 40_1 reduces the refresh period (Ref1 signal) and supplies the reduced refresh signal (Ref 1 signal) to the refresh counter 251_1 of the row address buffer 25_1. The refresh counter 251_1 starts the refresh operation based on the reduced refresh signal (Ref1 signal) supplied from the refresh controller 40_1.

As described above, in the present embodiment, the plurality of semiconductor chips include the SOC chip 11 (third semiconductor chip) that controls the DRAM chip 10 requiring the refresh operation. In the present embodiment, the SOC chip 11 corresponds to the above-mentioned first semiconductor chip 1. That is, the above-described first semiconductor chip includes the SOC chip 11. The DRAM chip 10 (second semiconductor chip) has the refresh controller 40, and the SOC chip 11 has the temperature sensor 31 (first temperature sensor). The refresh controller 40 changes the refresh period of the DRAM chip 10 depending on the output result of the temperature sensor 31 provided in the SOC chip 11.

This allows accurate detection of the temperature of the SOC chip 11 in which the temperature sensor 31 is incorporated so as to change the refresh period of the DRAM chip 10, thereby preventing the refresh period of the DRAM chip from being changed unnecessarily. As a result, it is possible to eliminate wasted current consumption in the semiconductor device 1.

Further, the DRAM chip 10 can reduce the refresh period in the wake of detection of increased temperature of the SOC chip 11 provided in the semiconductor device 1, thereby reducing the refresh period before the temperature of the DRAM chip 10 is increased to a high temperature. Thus, in the semiconductor device 1, occurrence of a failure in the DRAM chip 10 can be prevented.

Now, a semiconductor device according to a fourth embodiment will be described with reference to FIG. 9.

Fourth Embodiment

In the present embodiment, the semiconductor device 1 uses an auto-refresh command to execute the refresh operation.

Figure 9:
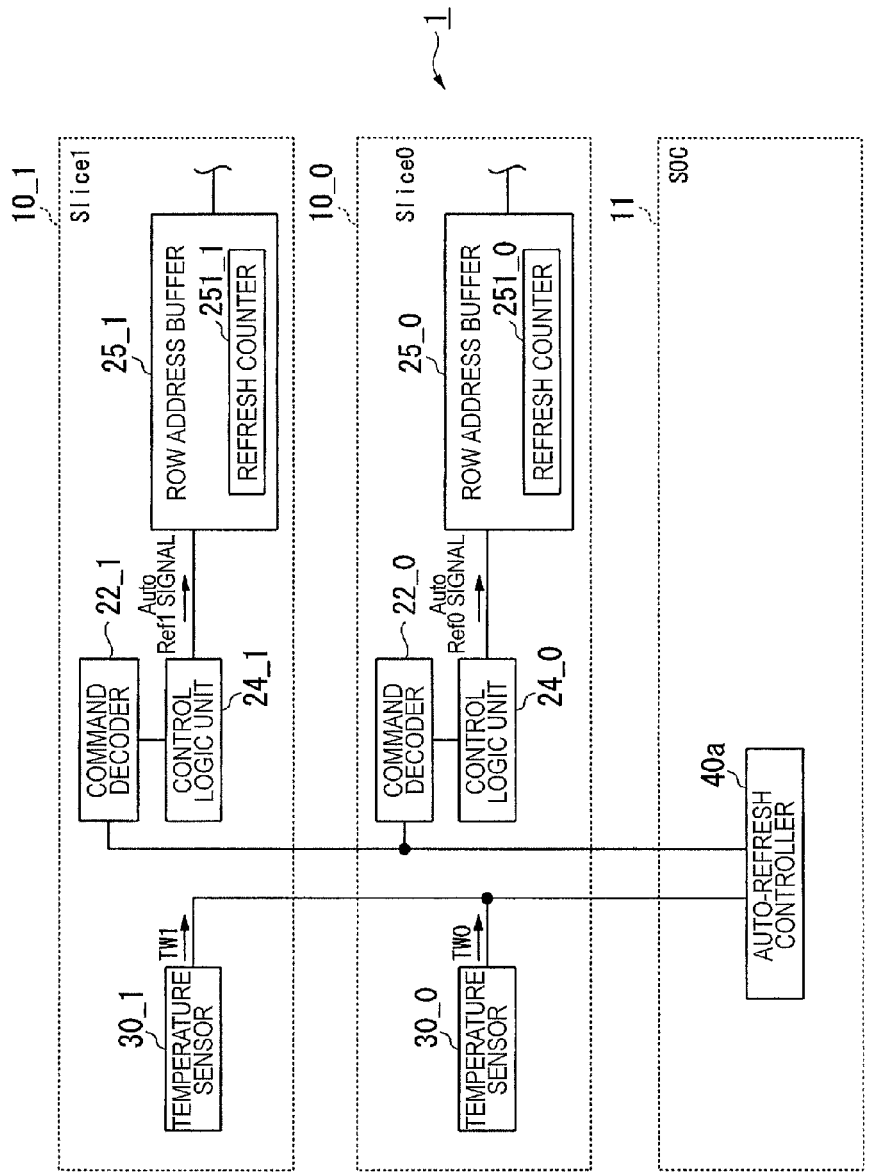
FIG. 9 is a block diagram indicative of a configuration of the semiconductor device according to a fourth embodiment of the present invention.

Turning to FIG. 9, the semiconductor device 1 has the DRAM chips 10 (10_0, 10_1) and SOC chip 11.

In the present embodiment, the DRAM chips 10 (10_0, 10_1) which are the second semiconductor chips (or the first semiconductor chips) each have the temperature sensor 30, command decoder 22, control logic unit 24, and row address buffer 25. That is, the DRAM chip 10_0 has the temperature sensor 30_0, command decoder 22_0, control logic unit 24_0, and row address buffer 25_0, and the DRAM chip 10_1 has the temperature sensor 30_1, command decoder 22_1, control logic unit 24_1, and row address buffer 25_1.

The SOC chip 11 (third semiconductor chip) is, e.g., a controller that controls the DRAM chip 10 and has an auto-refresh controller 40a.

The auto-refresh controller 40a (refresh controller) outputs an auto-refresh command to the command decoder 22 (22_0, 22_1) of the DRAM chip 10 with the predetermined period to cause the DRAM chip 10 to execute the refresh operation. For example, when one of the output signal of the temperature sensor 30_0 and output signal of the temperature sensor 30_1 assumes the H state, the auto-refresh controller 40a outputs the auto-refresh command to the command decoder 22 of the DRAM chip 10 with a period shorter than the above-mentioned predetermined period.

In the present embodiment, the auto-refresh controller 40a uses the open-drain output of the transistor to detect that one of the output signal of the temperature sensor 30_0 and output signal of the temperature sensor 30_1 assumes the H state through a single signal line, as in the case of the second embodiment.

In the present embodiment, each of the DRAM chips 10 executes the refresh operation when the auto-refresh command is supplied to the command decoder 22 thereof from the SOC chip 11.

For example, in the DRAM chip 10_0, the command decoder 22_0 generates an internal command for execution of the refresh operation based on the supplied auto-refresh command. The command decoder 22_0 supplies the generated internal command to the control logic unit 24_0. The control logic unit 24_0 supplies a refresh signal (Auto_Ref 0 signal) to the refresh counter 251_0 of the row address buffer 25_0 based on the internal command for execution of the refresh operation. The refresh counter 251_0 executes the refresh operation based on the refresh signal (Auto-Ref0 signal) supplied from the control logic unit 24_0.

Similarly, in the DRAM chip 10_1, the command decoder 22_1 generates an internal command for execution of the refresh operation based on the supplied auto-refresh command. The command decoder 22_1 supplies the generated internal command to the control logic unit 24_1. The control logic unit 24_1 supplies a refresh signal (Auto_Ref1 signal) to the refresh counter 251_1 of the row address buffer 25_1 based on the internal command for execution of the refresh operation. The refresh counter 251_1 executes the refresh operation based on the refresh signal (Auto-Ref1 signal) supplied from the control logic unit 24_1.

As described above, the plurality of semiconductor ships include the SOC chip 11 (third semiconductor chip) that controls the DRAM chip 10 requiring the refresh operation and the plurality of DRAM chips 10 (10_0, 10_1) which are the second semiconductor chips. When the DRAM chip 10_0 (10_1) is regarded as the second semiconductor chip which is its own semiconductor chip, the DRAM chip 10_1 (10_0) different from its own semiconductor chip can be regarded as the first semiconductor chip. That is, the plurality of second semiconductor chips can also be regarded as the first semiconductor chips. The DRAM chip 10 (10_0, 10_1) has the temperature sensor 30 (30_0, 30_1), and the SOC chip 11 has the auto-refresh controller 40a.

That is, the plurality of semiconductor chips further include the SOC chip 11 that controls the above-described first and second semiconductor chips (DRAM chips 10_0 and 10_1). The SOC chip 11 controls the refresh periods of the first and second semiconductor chips, respectively, depending on the output results of the first and second temperature sensors (temperature sensors 30_0 and 30_1).

Thus, the temperature sensor 30 (30_0, 30_1) accurately detects the temperature of the DRAM chip 10 (10_0, 10_1), and the SOC chip 11 changes the refresh period of the DRAM chip 10, thereby preventing the refresh period of the DRAM chip 10 from being changed unnecessarily. As a result, it is possible to eliminate wasted current consumption in the semiconductor device 1.

The SOC chip 11 can reduce the refresh period by detecting that temperature of one of the plurality of DRAM chips 10 (10_0, 10_1), so that the refresh period can be reduced before the temperature of the semiconductor chip 10 is increased to a high temperature. Thus, in the semiconductor device 1, occurrence of a failure in the DRAM chip 10 can be prevented.

The present invention is not limited to the above embodiments but may be modified without departing from the spirit of the present invention.

Although the DRAM chip 10 conforms to the 512-bit Wide-IO standard in the above embodiments, the DRAM 10 may conform to another standard or specification.

Further, although the semiconductor device 1 has the two DRAM chips 10 in the above embodiments, the semiconductor device 1 may have one DRAM chip 10 or three or more DRAM chips 10. Further, the SOC chip 11 need not always be provided in the semiconductor device 1.

For example, in a case where the semiconductor chip 1 has three semiconductor chips including the DRAM chip 10, another configuration may be adopted as long as the refresh period is changed depending on the output result of the temperature sensor 30 incorporated in at least one semiconductor chip different from a DRAM chip 10 in which the refresh operation is executed.

Figure 10:
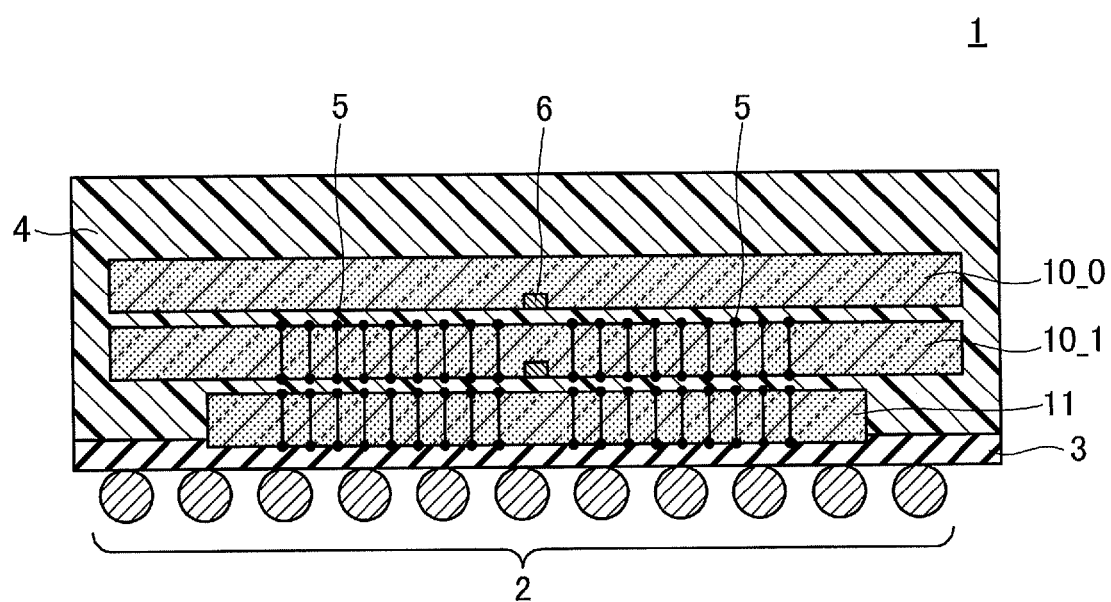
FIG. 10 is a cross sectional view indicative of a structure of a semiconductor device according to a fifth embodiment of the present invention.

Further, although all the semiconductor chips have the through electrodes in FIG. 1, the through electrodes need not be formed in all the semiconductor chips. For example, as illustrated in FIG. 10, a configuration may be possible in which the through electrodes are not formed in the semiconductor chip 10_0 stacked as the topmost layer.

Further, although the semiconductor device 1 has the configuration in which the plurality of semiconductor chips are mounted in a stacked manner using the TSV technology in the above embodiments, the present invention is not limited to this. For example, a configuration may be possible in which a plurality of semiconductor chips are arranged in a planar manner on an upper surface of the package substrate 3.

Further, although the H state and L state are defined as the first output state and second output state, respectively, in the above embodiments, the present invention is not limited to this.

Further, although two refresh periods are switched depending on the temperature in the above embodiments, two or more refresh periods may be switched depending on the temperature. Furthermore, the refresh periods may be changed by selecting one of previously generated clock signals of a plurality of frequencies. Alternatively, a VCO (Voltage Controlled Oscillator) is used to change a frequency to be output depending on variations in the temperature so as to change the refresh periods.

Further, although the semiconductor chips provided in the semiconductor device 1 include the DRAM chip 10 and SOC chip 11 in the above embodiments, a combination of other types of semiconductor chips may be employed as long as the semiconductor chips provided in the semiconductor device 1 include the semiconductor device requiring the refresh operation.

The semiconductor chip the present invention can be applied to a general semiconductor chip such as a CPU (Central Processing Unit), an MCU (Micro Control Unit), a DSP (Digital Signal Processor), an ASIC (Application Specific Integrated Circuit), an ASSP (Application Specific Standard Product), and a memory.

Further, in the above embodiments, the transistor used can be an FET (Field Effect Transistor). Other than the MOS (Metal Oxide Semiconductor), it can be applied to various types of FETs such as an MIS (Metal-Insulator Semiconductor) and a TFT (Thin Film Transistor). It can be applied to various FETs such as a transistor. A bipolar transistor can be included in a part of the device.

An NMOS transistor is a representative example of a first conductor type transistor and a PMOS transistor is a representative example of a second conduction type transistor.

What is claimed is:

1. A device comprising:
   a first semiconductor chip including a first temperature sensor outputting a first temperature signal;
   a second semiconductor chip coupled to receive the first temperature signal, the second semiconductor chip being configured to refresh data stored therein in a cycle that is response to the first temperature signal.

2. The device as claimed in claim 1, wherein the second semiconductor chip has a refresh control unit that controls the cycle in response to the first temperature signal.

3. The device as claimed in claim 2, wherein
   the first temperature sensor outputs the first temperature signal taking a first value when a temperature of the first semiconductor chip is equal to or higher than a first temperature and a second value when the temperature of the first semiconductor chip is lower than the first temperature, and
   the refresh control unit controls the cycle to a first cycle when the first temperature signal takes the first value and to a second cycle that is greater than the first cycle when the first temperature signal takes the second value.

4. The device as claimed in claim 3, wherein
   the second semiconductor chip has a second temperature sensor outputting a second temperature signal,
   the second temperature signal taking a third value when a temperature of the second semiconductor chip is equal to or higher than a second temperature and a fourth value when the temperature of the second semiconductor chip is lower than the second temperature, and the refresh control unit controls the cycle to the first cycle in response to at least one of the first temperature signal taking the first value and the second temperature signal taking the third value and to the second cycle in response to at least one of the first temperature signal taking the second value and the second temperature signal taking the fourth value.

5. The device as claimed in claim 1, wherein the second semiconductor chip has a second temperature sensor outputting a second temperature signal, and the cycle is further changed in response to the second temperature signal.

6. The device as claimed in claim 5, wherein the first semiconductor chip is coupled to receive the second temperature signal and configured to refresh data stored therein in a cycle that is responsive to both the first and second temperature signals.

7. The device as claimed in claim 6, further comprising a third semiconductor chip that controls the first and second semiconductor chips, the third semiconductor chip is coupled to receive the first and second temperature signals and configured to control each of the cycles in response to the first and second temperature signals.

8. The device as claimed in claim 1, further comprising a package substrate on which the first and second semiconductor chips are mounted, wherein the first and second semiconductor chips and the package substrate are encapsulated continuously by a resin.

9. The device as claimed in claim 8, wherein at least one of the first and second semiconductor chips has a plurality of through electrodes penetrating therethrough, the first temperature signal being conveyed via at least one of the through electrodes.

* * * * *